United States Patent
Kumada et al.

[11] 3,973,247
[45] Aug. 3, 1976

[54] METHOD OF WRITING AND ERASING INFORMATION FOR ELECTROOPTIC CERAMIC MEMORIES

[75] Inventors: Akio Kumada, Kokubungi; Koji Ishida, Tokyo, both of Japan

[73] Assignee: Hitachi, Ltd., Japan

[22] Filed: Apr. 8, 1974

[21] Appl. No.: 459,123

[30] Foreign Application Priority Data
Apr. 6, 1973   Japan................................ 48-38696

[52] U.S. Cl........................ 340/173.2; 340/173 LM; 350/150
[51] Int. Cl.² .................... G11C 11/22; G11C 11/42
[58] Field of Search .... 340/173.2, 173 LS, 173 LM, 340/173 LT; 350/150

[56] References Cited
UNITED STATES PATENTS

| | | | |
|---|---|---|---|
| 3,710,352 | 1/1973 | Smith et al. | 340/173.2 |
| 3,871,745 | 3/1975 | Waku et al. | 340/173.2 |

OTHER PUBLICATIONS

Ferro-electric Ceramic Stores High Resolution Images Optics and Laser Technology, 4/72, vol. 4, No. 2, pp. 91–92, S2702 0040.

*Primary Examiner*—Stuart N. Hecker
*Attorney, Agent, or Firm*—Craig & Antonelli

[57] ABSTRACT

An information is written or erased in such way that, while a memory employing electrooptic ceramics wherein a ferroelectric phase and an anti-ferroelectric phase (or paraelectric phase) coexist having a morphotropic phase boundary is being heated to a temperature at which the polymorphic base boundary of the ceramic material occurs, an electric field opposite in polarity to the spontaneous polarization of the memory is applied to the material.

According to the writing or erasing method, the writing of the information into the memory employing the material or the erasure of the information can be perfectly performed.

3 Claims, 10 Drawing Figures

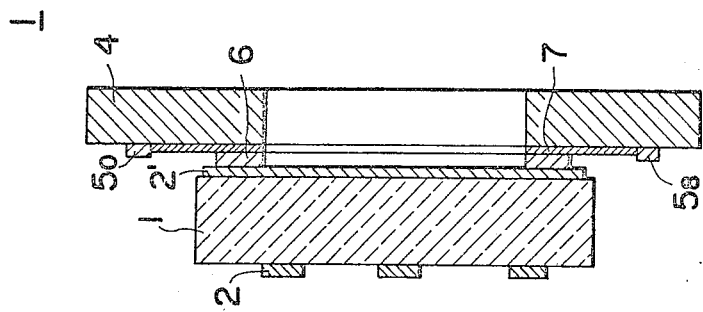
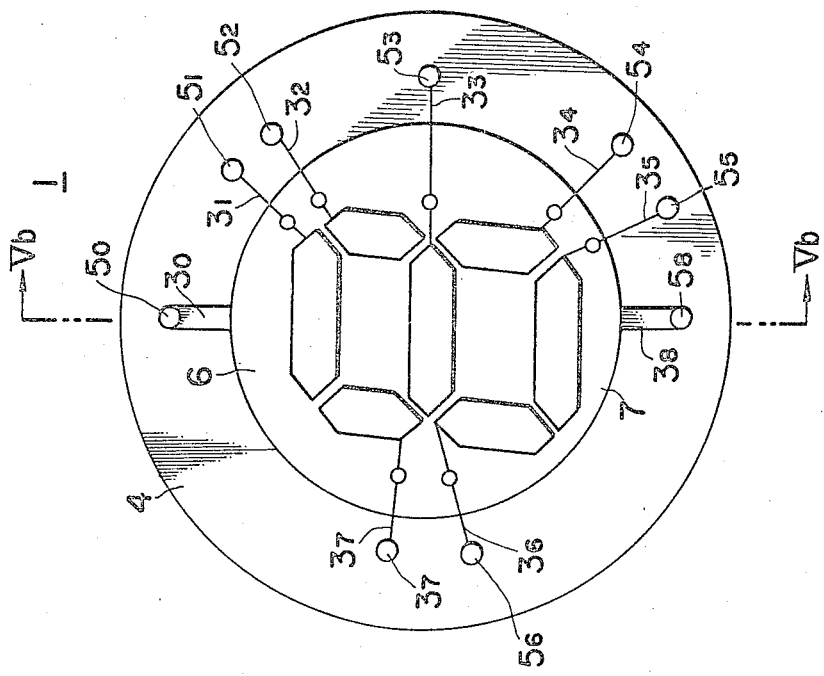

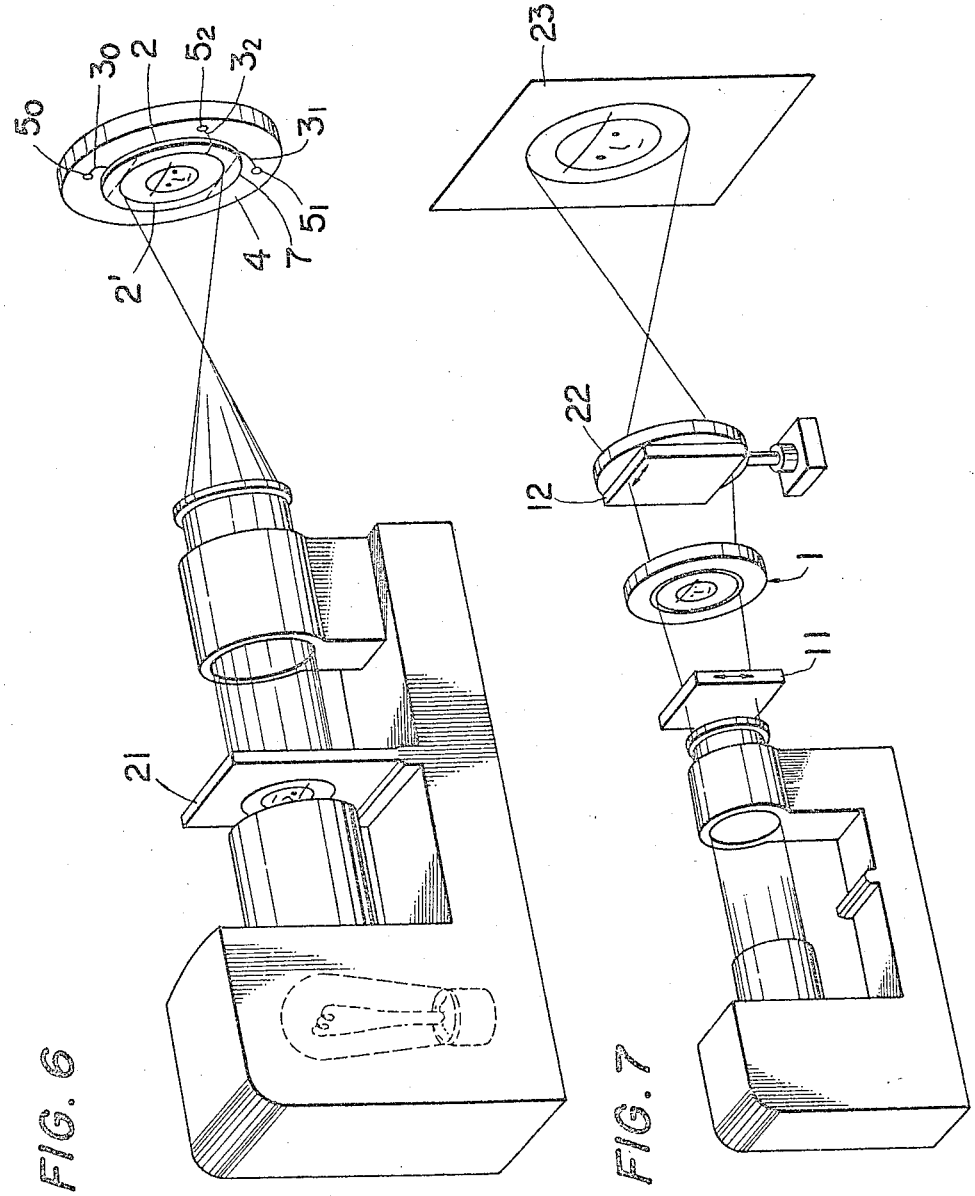

METHOD OF WRITING AND ERASING INFORMATION FOR ELECTROOPTIC CERAMIC MEMORIES

FIELD OF THE INVENTION

The present invention relates to a method of writing or erasing information for a memory device employing an electrooptic ceramic material in which a ferroelectric phase (hereinbelow termed "FE phase") and an anti-ferroelectric phase (hereinbelow termed "AFE phase") or paraelectric phase (hereinbelow termed "PE phase") coexist having a morphotropic phase boundary (the memory device being hereinbelow termed "electrooptic ceramic device").

BRIEF DESCRIPTION OF THE DRAWINGS

FIGS. 5a and 5b are a front view and a cross-sectional view of a numerical display element which is fabricated using an electrooptic ceramic element, respectively;

FIG. 6 is a view for explaining the principle of writing an image for an image storage device which is fabricated with the electrooptic ceramic element for use in the present invention;

FIG. 7 is a principle diagram for elucidating a display method for the image which is written by the method explained with reference to FIG. 6;

BACKGROUND OF THE INVENTION

Figure 1:
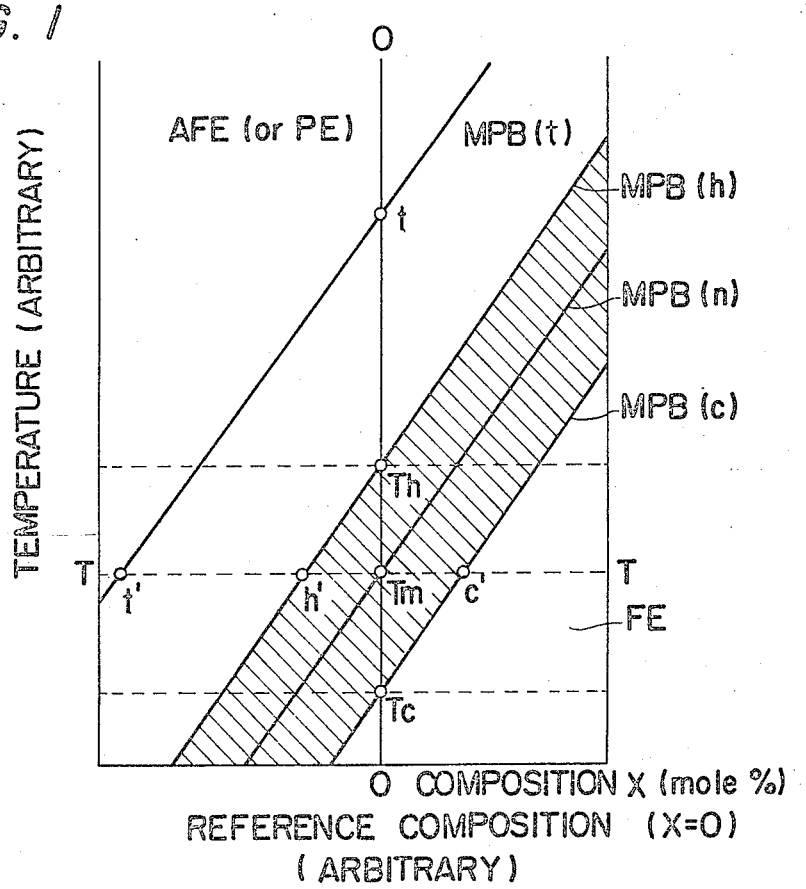
FIG. 1 is a schematic phase diagram illustrative of the correlation between the compositions and phases of an electrooptic ceramic material in which an FE phase and an AFE phase or PE phase coexist having a morphotropic phase boundary.

With respect to an electrooptic ceramic material wherein an FE phase and an AFE phase (or PE phase) coexist exhibiting a morphotropic phase boundary (hereinafter, simply termed MPB) relative to composition changes, an application has been filed as U.S. Ser. No. 384,225 on July 31, 1973.

The electrooptic ceramic material has the following properties:

1. In case where the MPB is the first order of a phase transition boundary phase:

a. In general, the thermal hysteresis is marked. Between a case where a specimen having the MPB is cooled from a high temperature and a case where it is heated from a low temperature, the MPBs arise in different places with respect to the temperature and the composition. Here, the MPB appearing in the case of lowering the temperature is termed the cooling morphotropic phase boundary and is represented by MPB(c), while the MPB appearing in the case of raising the temperature is named the heating morphotropic phase boundary and is denoted by MPB($h$). Then, in a region of a range held between the MPB($h$) and MPB($c$), one phase is stable and the other phase is metastable, and both the phases can coexist.

b. In general, within a specific temperature or composition range, when an electric field is applied, the MPB shifts with respect to the temperature or composition. Even when the electric field is removed, the original state is not perfectly restored, and the shift state is maintained.

2. The MPB is shifted by an electric field, which is attributed to the fact that an FE phase is induced by applying the electric field to a specimen.

a. Where the MPB is the boundary between two sorts of FE phases, for example, FE$\alpha$ phase and FE$\beta$ phase, the phase of greater spontaneous polarization Ps is induced in a single crystal, and hence, the MPB moves towards the phase of smaller Ps. In ceramics, the phase which is greater in the component Ps of polarization along the applied field, and the MPB moves towards the phase of smaller Ps.

b. Where the MPB is the boundary between the FE phase and the PE phase, the FE phase increases upon application of the electric field, and the MPB moves towards the PE phase.

c. Where the MPB is the boundary between the AFE phase and the FE phase, the MPB moves towards the AFE phase upon application of the electric field likewise to that described in case (b).

In the cases (b) and (c), the FE phase is induced upon application of the electric field to the specimen, and the MPB moves towards the AFE phase or the PE phase. Herein, however, the induction of the FE phase is subject to a limitation, and the MPB does not move beyond a certain position. Such limit of MPB is called the superheated limit in MPB, and is represented by MPB($t$).

3. Between the MPB($t$) and MPB($h$), the MPB returns to its position before the field application by removing the applied electric field, and the memory action is not exhibited. On the other hand, on the lower temperature side with respect to the MPB($h$), when an electric field of the reverse polarity is applied, the transition from the phase of greater Ps to the phase of smaller Ps appears. At a sufficiently lower temperature relative to the MPB($h$), however, even when the electric field of the reverse polarity is applied, the phase of greater Ps remains unchanged and is no longer switched to the phase of smaller Ps. (Hereinbelow, the limit to which the MPB can switch towards the phase of smaller Ps by the application of the electric field of the opposite sign is called the supercooled limit in MPB and is expressed by MPB($m$).

The foregoing characteristics of the MPB are illustrated in FIG. 1 in the relationship between the composition and the temperature, the scale being arbitrary and the standard (at $x=0$) being the composition of an arbitrary electrooptic ceramic material. As apparent from the figure, the following features are noted:

a. The AFE phase (or PE phase) and the FE phase can coexist only in a range sandwiched between the MPB(c) and MPB(h).

b. In an electrooptic ceramic material of the same composition, the two phases can coexist only between temperature points Th and Tc. At a point Tm of the MPB(m) (at a temperature of Tm), both the phases have equal thermodynamical potentials and are perfectly stable.

c. At the same temperature, the two phases can coexist only in a range between composition points h' and c'. t' indicates the point of limit to which the MPB can be moved into the AFE phase (or PE phase) by an external force (electric field).

Figure 2:
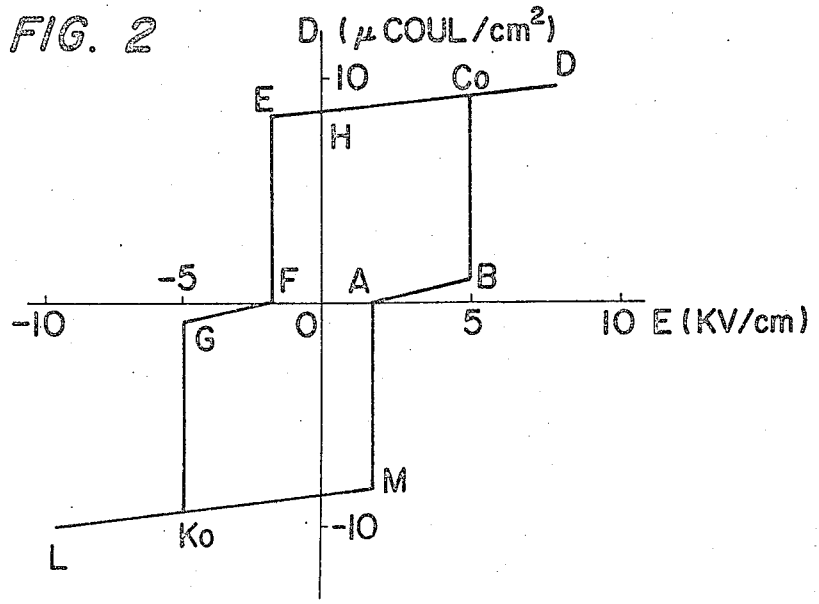
FIG. 2 is a characteristic curve diagram of the electric field (E) — versus — electric displacement (D) of the electrooptic ceramic material in which the FE phase and the AFE phase or PE phase coexist having the morphotropic phase boundary.
Figure 3:
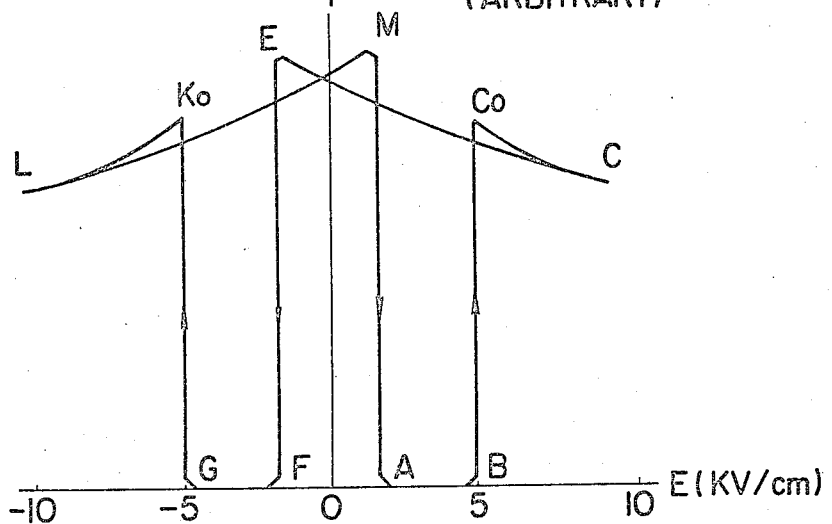
FIG. 3 is a characteristic curve diagram illustrating the relation of the electric field (E) — versus — transmitted light intensity (I) of the electrooptic ceramic material in which the FE phase and the AFE phase or PE phase coexist having the morphotropic phase boundary.

Further, the electric displacement versus electric field (D – E) hysteresis characteristic and the transmittance versus electric field (I – E) characteristic of a solid solution in which the FE phase and the AFE (or PE) phase coexist are respectively illustrated in FIGS. 2 and 3. In FIG. 2, A – B and F – G represent the D – E characteristics at the time when electric fields in ranges O – B and O – G are applied to the solid solutions in the AFE phase and the PE phase, respectively. As apparent from the figure, in these ranges of field application, electric displacements proportional to the applied electric fields arise, and the original states are restored after removal of the electric fields. In contrast, when an electric field exceeding the threshold value B (or G) is applied, the FE phase is induced, and an electric displacement shown at a point Co (or Ko) is obtained. Even when the electric field over B is applied, the electric displacement D is saturated. Even when the electric field is made zero, the polarization remains at H, and the FE state is held. However, when an electric field of the reverse polarity exceeding E is applied to the solid solution, the FE state returns to the AFE (or PE) state. Further, when an electric field of the reverse polarity exceeding G is applied, the FE phase is induced again. Eventually, the D – E characteristic of the solid solution in which the two phases coexist has double hysteresis loops along A–B–Co–C–H–E–F–G–K–M as illustrated. The I – E characteristic diagram in FIG. 3 illustrates the relationship between the quantities of transmitted light and AC voltages applied to a sheet, the relationship being obtained in a manner as now stated. That is, the above-stated AFE–FE coexisting solid solution is formed into the sheet by hot pressing, transparent electrodes are disposed on its front and back surfaces, the resultant sheet is inserted between a polarizer and an analyzer in the crossed arrangement in combination with a babine sorille compensator, and the AC voltages are applied to the sheet so as to vary polarization. As apparent from the figure, the light scattering is equal to zero and the quantity of transmitted light $I_{min}$ becomes almost zero in the AFE phase (or PE phase) corresponding to A – B and F – G of the hysteresis characteristic curves in FIG. 2. However, when the voltage applied to the sheet exceeds the threshold value B, the FE phase is induced, the light scattering and/or birefringence take place and the quantity of transmitted light $I_{max}$ increases. Therefore, by utilizing the change of the sheet between the FE phase and the AFE phase, the contrast ratio $I_{max}/I_{min}$ between the quantities of transmitted light can be made infinity in principle. In correspondence with the applied electric fields in FIG. 2, the sheet produces an I – E curve along A–B–Co–C–E–F–G–Ko–L in FIG. 3.

The temperatures and compositions at which, among the foregoing MPBs, the MPB(t), MPB(h), MPB(m) and MPB(c) in standard composition line O—O and temperature line T—T are generated are respectively represented by Tt, Th, Tm and Tc and by t', h', m' and c' as mentioned in FIG. 1. Then, the D – E characteristics at these points and in temperature and composition ranges intermediate between the respectively adjacent points produce hysteresis loops (a), (b), (c), (d), (e), (f) and (g) in FIG. 4. Straight lines M, T and S in FIG. 4 indicate MPB s, temperatures and compositions corresponding to the seven hysteresis loops, respectively. As seen from the D – E curves of FIG. 4, it is only in the range between MPB(m) and MPB(t) that double hysteresis loops are exhibited. Even in the range, however, the phase transition is not reversibly generated in the range between MPB(h) and MPB(t) by bringing the applied voltage into the reverse polarity. Accordingly, it is in the range between MPB(h) and MPB(m) that the phase transition can be reversibly performed with an external force (electric field) by the use of the solid solution in which the AFE phase (or PE phase) coexist having the MPB.

That is, by employing the solid solution in which the AFE phase (or PE phase) and the FE phase coexist having the MPB between the MPB(h) and MPB(m) and by applying thereto electric fields reverse in polarity to each other and over threshold values, the light scattering becomes zero in the AFE phase, the light scattering and/or birefringent state do not become zero in the FE phase, and both the phases can be reversibly shifted. The solid solution can therefore be used as a memory device.

As apparent from the shapes of the hysteresis loops in FIG. 4, the electrooptic ceramic material in which the FE phase and the AFE phase (or PE phase) coexist having the MPB has the memory action only at temperatures below Th as long as the same composition is concerned.

Consequently, in order to write a required information (for example, image) into such electrooptic ceramic material, the temperature need be lower than Th.

Figure 4:
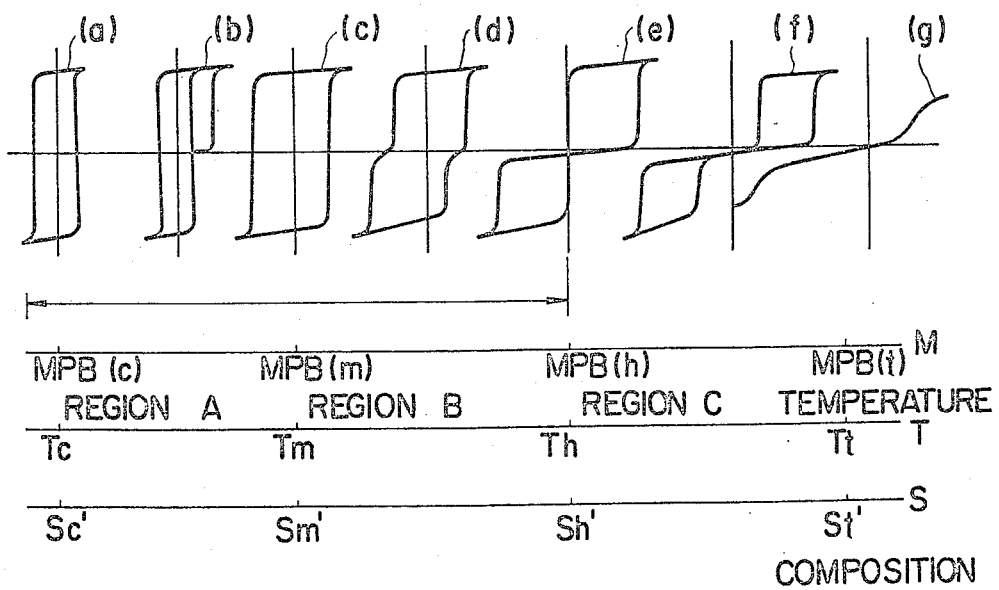
FIG. 4 shows D – E hysteresis loops corresponding to points $Tc$, $Tm$, $Th$ and $t'$ on the characteristic curve diagram of FIG. 1.

Regarding the erasure of the information having been written in the FE phase of the electrooptic ceramic material, as apparent from the double hysteresis loops shown in FIG. 4, the remanent polarization ought to become zero and the accumulated image ought to vanish when the specimen is heated to a temperature higher than Th. In experiments with an actual device, however, there is the tendency that the image is not extinguished by the mere heating beyond Th. The reason is interpreted as below. When the electrodes of the device are open, an internal electric field as stably holds the ferroelectric state or the image storing state will be generated in the FE phase on account of the pyroelectric effect based on the spontaneous polarization, and the stored image will produce the self-conserving action. Even if the electrodes are short-circuited, the self-conserving action will be produced similarly to the case of the open electrodes because the photoconductive film acts as an insulator without sufficient light impingement.

Where, in writing the image, the AFE phase (or PE phase) need be realized, the same as in the foregoing applies.

Examples of the electrooptic ceramic material in which the FE phase and the AFE phase or PE phase coexist having the MPB, comprise solid solutions whose general composition is represented by the following formula:

$$Pb_{(1-x-\alpha)}La_xA_\alpha(Zr_{(1-y-\beta)}Ti_yM_\beta)_{1-\frac{x+\alpha}{4}}O_3$$

subject to
$0 \leq x \leq 0.2$   $0 \leq y \leq 0.6$
$0 \leq \alpha < 1$,   $0 \leq \beta \leq 1$,
$0 \leq x+\alpha < 1$ and $0 \leq y+\beta \leq 1$, where $A$ denotes at least one element selected from the group consisting of divalent and trivalent alkaline earth elements and rare earth elements, and $M$ denotes at least one element selected from the group consisting of trivalent, tetravalent and pentavalent metallic elements.

It will be understood that suitable divalent alkaline earth elements include Mg, Ca, Sr, and Ba; suitable trivalent alkaline earth elements include Sc, Y, Al, Ga, In, Tl, Sb, and Bi; whereas suitable rare earth elements include La, Ce, Nd, Sm, Eu, Gd, Tb and Dy. The metallic elements represented by $M$ include Fe, Ni, and Co (trivalent) Hf, Si, Ge, and Sn (tetravalent) and V, Nb, Ta (pentavalent).

Such substances are exemplified in Table 1.

Table 1

| Composition | State | Tc | Tm | Th | Te | Tc/E (Degree . cm/RT) |
|---|---|---|---|---|---|---|
| $Pb_{.94}La_{.065}(Zr_{.80}Ti_{.20})_{.985}O_3$ | FE↔FE | −10°C. | 25°C. | 60°C. | 140°C. | 100 |
| $Pb_{.95}La_{.05}(Zr_{.84}Ti_{.16})_{.95}Fe_{.05}O_3$ | FE↔FE | −30°C. | 25°C. | 80°C. | 160°C. | 120 |
| $Pb_{.98}La_{.02}(Zr_{.92}Ti_{.08})_{.995}O_3$ | FE↔FE | | 25°C. | 75°C. | 180°C. | 120 |
| $Pb(Zr_{.95}T_{.05})O_3$ | " | | 25°C. | 50°C. | 200°C. | 60 |
| $Pb_{.84}La_{.16}(Zr_{.30}Ti_{.70})_{.96}O_3$ | PE↔FE | 25°C. | 25°C. | 27°C. | | 10 |
| $Pb_{.80}La_{.20}(Zr_{.15}Ti_{.85})_{.95}O_3$ | " | 25°C. | 25°C. | 26°C. | | 5 |
| $Pb_{.76}La_{.24}(Zr_{.05}Ti_{.95})_{.94}O_3$ | " | 25°C. | 25°C. | 26°C. | | 2 |
| $Pb(Zr_{.455}Sn_{.455}Ti_{.09})O_3$ | FE↔FE | 20°C. | 30°C. | 40°C. | 70°C. | 4.8 |
| $Pb_{.99}(Zr_{.60}Sn_{.40}Ti_{.07})_{.98}Nb_{.02}O_3$ | FE↔FE | −20°C. | 25°C. | 70°C. | 150°C. | 100 |
| | PE↔FE | 15°C. | 25°C. | 35°C. | 70°C. | 8 |
| $Pb_{.88}La_{.06}Sr_{.06}(Zr_{.68}Ti_{.32})_{.97}O_3$ | FE↔FE | −5°C. | 25°C. | 50°C. | 80°C. | 80 |
| $Pb_{.84}La_{.05}Sr_{.11}(Zr_{.60}Ti_{.40})_{.96}O_3$ | " | 10°C. | 25°C. | 40°C. | 100°C. | 60 |
| $Pb_{.76}La_{.04}Ba_{.20}(Zr_{.60}Ti_{.40})_{.94}O_3$ | FE↔FE | −10°C. | 25°C. | 60°C. | 130°C. | 100 |
| $Pb_{.94}La_{.06}(Hf_{.80}Ti_{.20})_{.985}O_3$ | | | | | | |
| $Pb_{.93}La_{.07}(Hf_{.75}Ti_{.25})_{.983}O_3$ | " | 0 | 25°C. | 50°c. | 80°C. | 90 |
| $Pb_{.93}La_{.06}Sr_{.01}(Zr_{.65}Ti_{.35})_{.983}O_3$ | " | 25°C. | 25°C. | 32°C. | 120°C. | 8 |
| $Pb_{.921}La_{.079}(Zr_{.65}Ti_{.35})_{.98}O_3$ | " | 38°C. | 45°C. | 55°C. | 75°C. | 45 |
| $Pb_{.919}La_{.081}(Zr_{.65}Ti_{.35})_{.98}O_3$ | " | 28°C. | 35°C. | 45°C. | 65°C. | 45 |
| $Pb_{.915}La_{.085}(Zr_{.65}Ti_{.35})_{.979}O_3$ | " | 8°C. | 15°C. | 25°C. | 45°C. | |

In Table 1, "AFE ↔ FE" and "PE ↔ FE" in the second column or state column indicate that the reversible phase transitions between the anti-ferroelectric phase and the ferroelectric phase and between the paraelectric phase and the ferroelectric phase are possible, respectively. "do" means the same transition as in the above line. "RT" in (Degree. cm/RT) in the seventh column represents the room temperature.

SUMMARY OF THE INVENTION

An object of the present invention is to provide an accumulated information-erasing method which is free from the foregoing disadvantage in the case of retaining or erasing an information stored in a memory device employing an electrooptic ceramic material in which an FE phase and an AFE phase (or PE phase) coexist having an MPB.

The subject matter of the present invention consists in that, as a device employing an electrooptic ceramic material wherein an FE phase and an AFE phase (or PE phase) coexist having an MPB is being heated to a temperature beyond the vicinity of the temperature T$h$ at which a polymorphic phase boundary occurs, an electric field reverse in polarity to the polarization of a ferroelectric state is applied to the device.

When, as in the present invention, while the device employing the electrooptic ceramics of the foregoing properties and accumulating a predetermined information is being heated to a temperature over the temperature point T$h$ at which the polymorphic phase boundary appears, the self-conserving action previously stated will be weakened to that extent. It is considered that, as the device is heated to a higher temperature, the effect of extinguishing the accumulated information is enhanced more. However, energy consumption for the heating increases more, which is unfavorable in practical use. On the other side, even at a temperature lower than the temperature T$h$ at which the polymorphic phase boundary appears in the device, the accumulated information vanishes once by applying a reverse polarity-electric field of a suitable magnitude.

The erasing method for the device as invented on the basis of this principle will be described hereunder in connection with the following embodiments.

DESCRIPTION OF THE PREFERRED EMBODIMENTS

Embodiment 1

Powders of PbO, $ZrO_2$, $TiO_2$ and $La_2O_3$ were weighed by amounts for providing a composition of $Pb_{0.914}La_{0.084}(Zr_{0.65}Ti_{0.35})_{0.979}O_3$. The powders were mixed, and calcined at 900°C. for 1 hour. The calcined mixture was pulverized and molded, and was hot-pressed at 1,150°C. under a pressure of 3,000 psi for 16 hours. Thus, cylindrical PLZT boules 15 mm in diameter and 10 mm in height were obtained. The expression PLZT means ferroelectric ceramics in which a Pb(Zr,Ti)O$_3$ system-ceramic has several % of La added thereto.

The PLZT boule was sliced into disks 0.4 mm thick by means of a diamond cutter. Each disk had both surfaces polished roughly, into a parallel flat plate 200 μm thick. The surfaces were finished by the pitch lapping, into optical flat surfaces having a flatness of approximately λ/10.

The light transmittivity of the samples thus polished was about 68%. The element plates were placed into an electric furnace, and were heated to approximately 500°C. Under this state, an aqueous solution having SnCl$_4$ as its principal constituent was sprayed, to coat the whole areas of both the surfaces of each sample with transparent electrodes 2 and 2'. After cooling the element plate to the room temperature, the electrode on its one surface was partially etched by the photoresist process. Thus, electrodes on the back surface separated into seven segments of a figure of 8 (eight) as shown in FIG. 5a were obtained. As illustrated in FIG. 5a and FIG. 5b which is a cross-sectional view corresponding to FIG. 5a, gold films 6 and 7 were evaporated at the upper and lower ends. Lead wires $3_0$ and $3_8$ were connected to the gold films, while lead wires $3_1$, $3_2$, . . . and $3_7$ were connected to the respective electrodes of the seven segments so that voltages could be independently applied thereto.

The element plate was stuck onto an acrylic resin plate 4 which was formed with a circular hole at its central part. The acrylic resin plate was provided with nine terminals $5_0$, $5_1$, . . . and $5_8$. Under the state under which the element plate was sandwiched between two crossed polars 11 and 12 (as shown in FIG. 7), the respective polars were stuck to the acrylic resin substrate. In this way, a numerical display element 1 as shown in FIG. 5a was fabricated.

When the terminals $5_0$ and $5_8$ were grounded and a voltage of 80 volts was applied to predetermined ones of the terminals $5_1 - 5_7$, the voltage-applied segments became the ferroelectric phase and became bright. Therefore, an arbitrary numeral came into clear relief and was displayed.

Subsequently, in order to erase the numeral and to display another numeral anew, a resistor of 50 Ω was connected to the terminal $3_0$, the terminals $3_1 - 3_7$ were grounded and a voltage of 20 volts was applied to the terminal $3_8$. Then, the numeral disappeared fully in approximately 1/10 second.

Further, when the voltage of 80 volts was applied to predetermined ones of the terminals $3_1 - 3_7$ likewise to the foregoing, the another numeral appeared vividly. It has been found that the contrast ratio is very high.

When the contrast ratio was quantitatively measured, large values of 100 – 500 were obtained. This will be described in detail in the following embodiment.

Embodiment 2

One surface of an electrooptic memory element plate 30 mm in diameter and 0.2 mm in thickness having a composition of Pb$_{0.928}$La$_{0.072}$(Zr$_{0.73}$Ti$_{0.027}$)$_{0.983}$O$_3$ and fabricated by the same method as in Embodiment 1 was coated with the electrode 2 made by the method of Embodiment 1. As shown in FIGS. 5a and 5b, gold was evaporated to a thickness of about 1 μm at both the end parts 6 and 7 of the electrode 2. On the other surface of the element plate, polyvinylcarbazole (PVCz) being an organic photoconductive material was applied uniformly to a thickness of about 1 μm.

The PVCz layer was coated with (In$_2$O$_3$)$_{0.91}$—(SnO$_2$)$_{0.09}$ at a low temperature by the sputtering process. Thus, the transparent electrode of low resistance 2' was provided as shown in FIG. 6.

Lead wires $3_0$, $3_2$ and $3_1$ were connected to the electrodes 6, 7 and 2', respectively. The element plate was fixed to the acrylic resin substrate 4 as in Embodiment 1.

The three lead wires were connected to the terminals $5_0$, $5_2$ and $5_1$ on the acrylic resin substrate, respectively. On the face of the image storage device 1 thus constructed, a slide image 21 was vividly focused by the use of a slide projector as shown in FIG. 6. Simultaneously therewith, the gold films 6 and 7 of the image storage device were grounded, and a voltage of 120 volts was applied to the transparent electrode 2' on the back surface for 0.2 second. In this manner, the image was written.

The element 1 was sandwiched between the crossed polars 11 and 12, and the slide was taken away from the slide projector, and the face of the element 1 was uniformly irradiated. When, with an arrangement in FIG. 7, transmitted light through the element 1 was projected onto a screen 23 by a lens 22, the same picture as that of the slide was clearly displayed.

Figure 8:
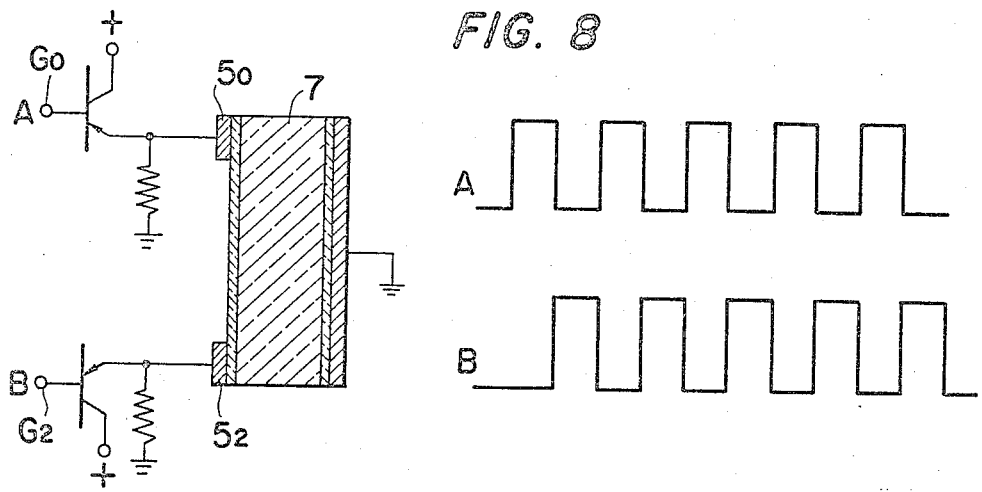
FIG. 8 is a diagram of a circuit for erasing with heat and electric field the image which is written in the image storage device employing the electrooptic ceramic element of the present invention.
Figure 9:
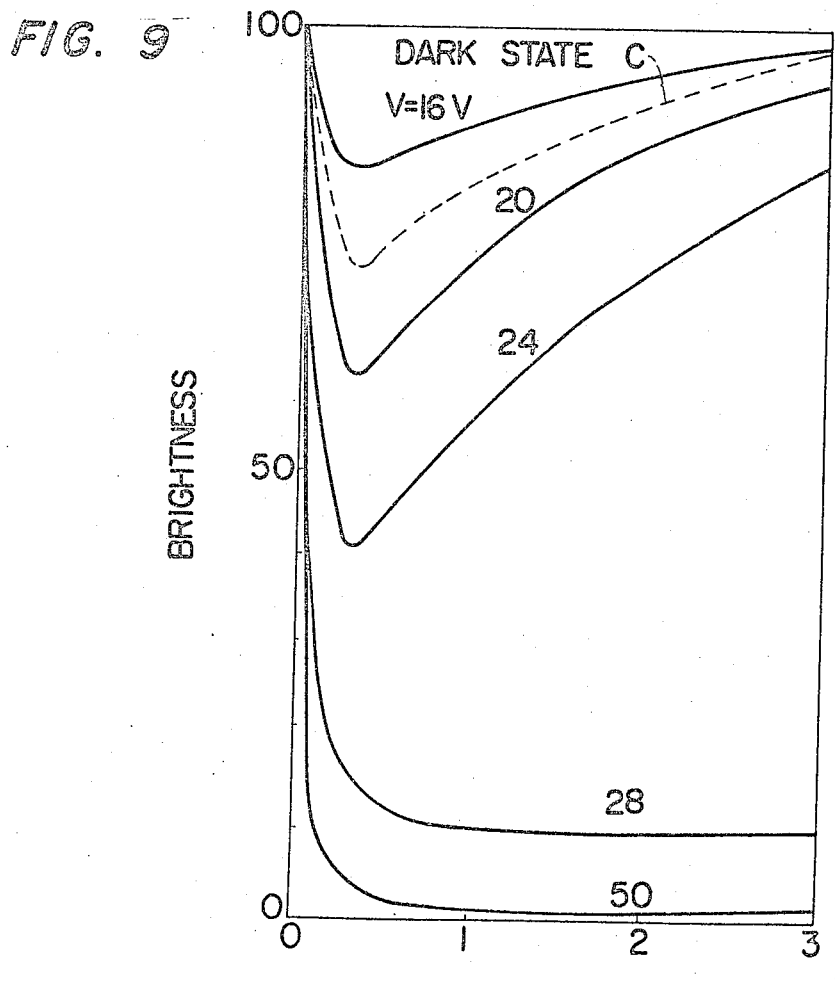
FIG. 9 is a characteristic diagram illustrating with erasing voltages made a parameter the state in which the brightness of a picture frame changes with time when the image written in the device is erased by the use of the erasing circuit of FIG. 8.

The image becoming unnecessary after the writing and display was fully erased by an erasing circuit employing heat and electric field as shown in FIG. 9. The erasing circuit of FIG. 9 grounds the terminals $5_0$ and $5_2$ by resistors of 50 Ω, and connects them to a DC power source of 40 volts through gates G$_0$ and G$_2$, respectively. The gates G$_0$ and G$_2$ are alternately switched 10 times at every 5 ms, and supply 10 cycles of pulse current in 100 ms. Therefore, the device has voltages reverse in polarity to the polarization impressed simultaneously with being heated. Although the voltages are about 40 volts on the side of the terminal on which the gate is on and about 20 volts on the side of the terminal on which the gate is off and the potential within the face of the device varies with time, the average voltage is 30 volts in any place. For this reason, the image was extinguished completely and uniformly. FIG. 8 shows, with the erasing voltage made a parameter, changes of the brightness of a picture frame with time in the case where writing was performed under the state under which the whole area of the device 1 was made uniformly bright without using any slide and where erasure was thereafter performed by the erasing circuit. I$_{min}$ in these conditions was 1/500 of I$_{max}$, that is, the contrast ratio was about 500.

When the erasing voltage was 30 volts or higher, the image was erased substantially perfectly, and the device fell into the anti-ferroelectric state. Subsequently, using a slide one half of which was transparent and the other half pitchdark, writing was performed. The ratio between the quantities of light at the bright part and at the dark part was measured in such way that a light quantity detector was placed in front of the screen in FIG. 7.

The contrast ratio of brightness obtained was 130. From this fact, it is evident that the erasing method with heat and electric field is excellent. Notwithstanding that, as previously stated, the ratio between the quantity of light measured after the writing of the wholly bright image and the quantity of light measured after the erasure thereof was 500, the contrast ratio measured by making the bright part and the dark part on the identical picture frame was 130. This will possibly be ascribable to the fact that the light of the bright part impinges on the dark part as noises, the value $I_{min}$ does not become sufficiently small.

As the new method of image erasure for the electrooptic memory device coated with the photoconductive films, the principle of the simultaneous application of heat and electric field has been described. An actual example of the concrete switching circuit therefor has also been described. To be noted here is the following. The voltage applied at the erasure generates the Joule's heat by causing a current to flow through the transparent electrodes, and also impresses the reverse voltage on the device by a voltage drop across the load resistance 50 Ω. The voltage becomes meaningless if applied to the photoconductive films, and must be effectively impressed on the PLZT. For this reason, in erasing an image in the image memory device coated with the photoconductive films, it is naturally required that while the erasing pulses in FIG. 8 are being applied, the whole area of the device is irradiated uniformly brightly. Where the device is not sufficiently irradiated by light, the image is hardly erased even by actuating the erasing circuit. This status is also apparent from a curve c indicated as the dark state in FIG. 9.

Although the foregoing description has been made of the case of using the ferroelectric phase as the writing state and the non-ferroelectric phase as the erasure state, the same applies to a case of employing the ferroelectric phase as the erasure state for the purpose of the reversal of the negative and positive of an image. More specifically, to the end of inverting the brightness and darkness of the image of the slide 21 for use in the slide projector in FIG. 7, the entire area of the device 1 is first irradiated uniformly without the slide, to bring it into the erasure state. Subsequently, the image of the slide 21 is written by the erasing circuit and the erasing system which have been already stated. The difference from the case of the usual erasure is that the device is not uniformly irradiated. In the face of the device 1, a place corresponding to the bright part of the slide 21 has the ferroelectric phase removed and becomes dark. Conversely, a place corresponding to the dark part of the slide remains in the dark state shown by the dotted line in FIG. 8 on account of insufficient light even when the erasing circuit operates, and is scarcely changed in the brightness of the image. In consequence, the reversal image of the slide 21 is written in the device 1.

The foregoing description has been made of an example in which the invention is applied to the reversal means for the negative and positive images. Essentially, however, the invention concerns the system in which, to the end of storing or erasing information, the ferroelectric phase is switched to the non-ferroelectric phase more speedily and more perfectly by the simultaneous application of the voltage and heat to the ceramic element.

While the novel embodiments of the invention have been described, it will be understood that various omissions, modifications and changes in these embodiments may be made by one skilled in the art without departing from the spirit and scope of the invention.

What is claimed is:

1. A method for erasing information stored in an electrooptic ceramic plate composed of an electrooptic ceramic in which a ferroelectric phase and an anti-ferroelectric or para-electric phase can coexist with a morphotropic phase boundary therebetween, said electrooptic ceramic formed from a solid solution of the following formula $$Pb_{(1-x-\alpha)}La_x A_\alpha )Zr_{(1-y-\beta)}Ti_y M_\beta )1 - \frac{x+\alpha}{4}.O_3$$

wherein
$0 \leq x \leq 0.2$   $0 \leq y \leq 0.6$
$0 \leq \alpha < 1$   $0 \leq \beta \leq 1$
$0 \leq x + \alpha < 1$ and $0 \leq y + \beta \leq 1$.

wherein A denotes at least one element selected from the group consisting of Mg, Ca, Sr, Ba, Sc, Y, Al, Ga, In, Tl, Sb, Bi, La, Ce, Nd, Sm, Eu, Gd, Tb, and Dy, M representing at least one element selected from the group consisting of Fe, Ni, Co, Hf, Si, Ge, Sn, V, Nb, and Ta, said information being stored in the form of a pattern in said electrooptic ceramic plate, said pattern being defined by regions in the ferroelectric phase and regions in the anti-ferroelectric or para-electric phase, said method comprising a. maintaining said electrooptic ceramic plate at a temperature intermediate the temperature $T(h)$ generating the heating morphotropic phase boundary in said electrooptic ceramic and the temperature $T(c)$ generating the limiting morphotropic phase boundary in said electrooptic ceramic, and b. applying an electric field reverse in polarity to the spontaneous polarization of the ferroelectric phase in said electrooptic ceramic plate and simultaneously heating said electrooptic ceramic plate by the current of said applied electric field to a temperature higher than the temperature $T(h)$, whereby the stored information is erased from said electrooptic ceramic plate.

2. A method for writing information in an electrooptic ceramic plate composed of an electrooptic ceramic in which a ferroelectric and anti-ferroelectric or para-electric phase can coexist with a morphotropic phase boundary therebetween, said electrooptic ceramic formed from a solid solution of the following formula $$Pb_{(1-x-\alpha)}La_x A_\alpha (Zr_{(1-y-\beta)}Ti_y M_\beta )1 - \frac{x+\alpha}{4}.O_3$$

wherein
$0 \leq x \leq 0.2$   $0 \leq y \leq 0.6$
$0 \leq \alpha < 1$   $0 \leq \beta \leq 1$
$0 \leq x + \alpha < 1$ and $0 \leq y + \beta \leq 1$ wherein A denotes at least one element selected from the group consisting of Mg, Ca, Sr, Ba, Sc, Y, Al, Ga, In, Tl, Sb, Bi, La, Ce, Nd, Sm, Eu, Gd, Tb, and Dy, M representing at least one element selected from the group consisting of Fe, Ni, Co, Hf, Si, Ge, Sn, J, Nb, and Ta, said electrooptic ceramic plate being entirely in the ferroelectric state, said electrooptic ceramic being maintained at a temperature intermediate the temperature $T(h)$ generating the heating morphotropic phase boundary in said electrooptic ceramic and the temperature $T(c)$ generating the limiting morphotropic phase boundary in said electrooptic ceramic, said method comprising applying to said electrooptic plate an electric field reverse in polarity to the spontaneous polarization of said electrooptic ceramic plate in accordance with the pattern of the desired information to be written into said electrooptic ceramic plate and simultaneously heating said electrooptic ceramic plate in accordance with said pattern by the current produced by said electric field to a temperature above T(h) to thereby write said information into said electrooptic ceramic plate.

3. A method for writing information in an electrooptic ceramic plate composed of an electrooptic ceramic in which a ferroelectric and anti-ferroelectric or paraelectric phase can coexist with a morphotrophic phase boundary therebetween, said electrooptic ceramic formed from a solid solution of the following formula:

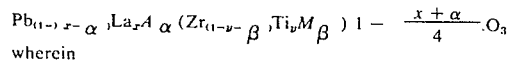

wherein
$0 \leq x \leq 0.2$     $0 \leq y \leq 0.6$
$0 \leq \alpha < 1$     $0 \leq \beta \leq 1$
$0 \leq x+\alpha < 1$ and $0 \leq y+\beta \leq 1$ wherein A denotes at least one element selected from the group consisting of Mg, Ca, Sr, Ba, Sc, Y, Al, Ga, In, Tl, Sb, Bi, La, Ce, Nd, Sm, Eu, Gd, Tb, and Dy, M representing at least one element selected from the group consisting of Fe, Ni, Co, Hf, Si, Ge, Sn, J, Nb, and Ta, said method comprising a. maintaining said electrooptic ceramic plate at a temperature intermediate the temperature T(h) generating the heating morphotropic phase boundary in said electrooptic ceramic and the temperature T(c) generating the limiting morphotropic phase boundary in said electrooptic ceramic, b. applying an electric field to said electrooptic ceramic plate to thereby change the state of said plate entirely to ferroelectric state and then c. applying to said electrooptic ceramic plate an electric field reverse in polarity to the spontaneous polarizaion of said electrooptic ceramic plate in accordance with the pattern of the desired information signal to be written into said electrooptic ceramic plate and simultaneously heating said electrooptic ceramic plate in accordance with said pattern by the current produced by said electric field to a temperature above temperature T(h) to thereby write said information into said electrooptic ceramic plate.

* * * * *